US005115473A

United States Patent [19]

Yamagishi et al.

[11] Patent Number: 5,115,473

[45] Date of Patent: May 19, 1992

[54] TRANSDUCER HAVING TWO DUCTS

[75] Inventors: Makoto Yamagishi, Tokyo; Masao Fujihira, Kanagawa; Kazuo Azami, Saitama; Ikuo Shinohara, Tokyo, all of Japan

[73] Assignee: Sony Corporation, Tokyo, Japan

[21] Appl. No.: 561,864

[22] Filed: Aug. 2, 1990

[30] Foreign Application Priority Data

Sep. 4, 1989 [JP] Japan ............................ 1-103586[U]
Feb. 19, 1990 [JP] Japan ............................ 2-38082[U]

[51] Int. Cl.[5] ....................... H04R 25/00; H04R 1/02; H05K 5/00

[52] U.S. Cl. ................................... 381/154; 381/159; 381/88; 181/156

[58] Field of Search ..................... 381/154, 89, 88, 90, 381/159, 188, 205; 181/156, 148, 129, 135

[56] References Cited

U.S. PATENT DOCUMENTS

| | | | |
|---|---|---|---|
| 3,777,844 | 12/1973 | Johnson | 181/199 |
| 4,031,318 | 6/1977 | Pitre | 181/148 |
| 4,742,887 | 5/1988 | Yamagishi | 381/154 |
| 4,815,546 | 10/1989 | Krnan | 381/90 |

FOREIGN PATENT DOCUMENTS

| | | | |
|---|---|---|---|
| 2459599 | 2/1981 | France | 181/148 |
| 489588 | 7/1938 | United Kingdom . | |
| 0851503 | 10/1960 | United Kingdom | 381/154 |
| 912430 | 12/1962 | United Kingdom . | |
| 1528066 | 10/1978 | United Kingdom . | |

*Primary Examiner*—James L. Dwyer
*Assistant Examiner*—Jason Chan
*Attorney, Agent, or Firm*—Lewis H. Eslinger; Jay H. Maioli

[57] ABSTRACT

The present invention relates to a so-called bass-reflex electroacoustic transducing apparatus, wherein a plurality of sound ducts (ports) having the same equivalent mass and different lengths are provided in communication with a housing which incorporates therein an electroacoustic transducing element. Thus, resonance and antiresonance generated in respective sound ducts cancel each other out, thereby preventing a tone quality of a reproduced sound from being deteriorated.

7 Claims, 10 Drawing Sheets

TRANSDUCER HAVING TWO DUCTS

BACKGROUND OF THE INVENTION

1. Field of the Invention

The present invention generally relates to electroacoustic transducers and more particularly to a bass-reflex type electroacoustic transducer having two ducts.

2. Description of the Prior Art

As a prior-art sound emanating device, a bass-reflex type cabinet is widely used, in which while an inner volume of a cabinet incorporating therein a speaker is kept constant, a low band of a reproduced sound is extended by decreasing a threshold frequency $f_L$. FIG. 1 schematically illustrates an example of such bass-reflex type cabinet which is generally represented by reference numeral 10 therein.

As shown in FIG. 1, in the bass-reflex cabinet 10, a duct or port 11 is provided in a speaker mount surface 10*f*, whereby a phase of an acoustic wave emanated to the rear side of a diaphragm of a speaker unit 1 is inverted by equivalent mass of the port 11 and stiffness presented by air within the cabinet 10 so as to be emanated with an acoustic wave emanated from the front of the speaker 1 in the same phase as each other.

L (cm) assumes the length of the port 11, S ($cm^2$) assumes the cross sectional area of the port 11 and a (cm) assumes the effective radius of the speaker unit 1. Then, the equivalent mass m (gram) of the port 11 is expressed by the following equation (1):

$$m \approx \frac{355 \cdot a^4}{30000} \cdot \frac{(L + 0.96\sqrt{S})}{S} = 0.0118 \cdot a^4 \cdot L_e/S \tag{1}$$

where $L_\theta = L + 0.96\sqrt{S}$ is established.

For example, for the speaker unit 1 having an aperture with the diameter of 6.5 cm and an effective radius a =2.5 cm, the length $L_{1\,1}$ and the cross sectional area $S_{1\,1}$ of the port 11 are determined as follows:

$L_{1\,1}=5.5$ cm and $S_{1\,1}=3.23$ $cm^2$

In that case, the effective length $L_{\theta 1\,1}$ and equivalent mass $m_{1\,1}$ of the port 11 take the following values:

$L_{\theta 1\,1}=7.2$ cm and $m_{1\,1}=1.03$ g

A sound pressure versus frequency characteristic thereof is represented in FIG. 2.

Further, the bass-reflex type electroacoustic transducer employs the single port as shown in FIG. 1 and it is frequently observed that two ports whose resonance frequencies are set to low and middle sound bands as described in Japanese Laid-Open Utility Model Gazette No. 53-4929.

While the bass-reflex cabinet incorporating therein the speaker is presented as described above, a bass-reflex type headphone or earphone and the like are known, in which the port 11 is provided at the rear portion of a housing 8 of a headphone unit 9 having an ear pad load 7 provided in front of a diaphragm 4 as shown in FIG. 3. Also in such headphone, equivalent mass m (gram) thereof is designed so as to satisfy the equation (1) when the effective radius of the diaphragm 4 of the headphone unit 9 is taken as a (cm), the length of the port 11 is taken as L (cm) and the cross sectional area of the port 11 is taken as S ($cm^2$). FIG. 4 shows a sound pressure versus frequency characteristic where the length and cross section area of the port 11 are $L_{1\,1}=12$ cm and $S_{1\,1}'=7$ $mm^2$ for the diaphragm whose aperture is 3 cm in diameter and of which the effective radius a is 15 mm.

As is clear from the aforenoted equation (1), if the cross section area S of the port 11 is determined small, then a predetermined equivalent mass m can be obtained regardless of the short length L. In that case, however, air resistance of the port 11 is increased and air flow velocity is increased, thus resulting in a so-called wind noise being increased. To avoid this disadvantage, the port 11 having the sufficient cross section area and length is employed as represented in the example of the aforenoted numerical values.

Nevertheless, if the length of the port 11 is increased, then resonance and antiresonance of air within the port 11 occur in the middle and high sound bands. There is then the substantial disadvantage that tone quality of a reproduced sound will be deteriorated.

If the following equation (2) is established as $$L_\theta = 2\,n \cdot \lambda/4 \tag{2}$$

where λ (cm) represents the wavelength of the reproduced sound and n represents the natural number, resonance occurs so that acoustic impedance of the port 11 seen from the inside of the cabinet 10 is minimized. Consequently, as shown in FIGS. 2 and 4, a peak 6 appears in the middle and high bands of the sound pressure versus frequency characteristic.

If the following equation (3) is established as $$L_\theta = (2n-1)\lambda/4 \tag{3}$$

antiresonance occurs so that acoustic impedance of the port 11 seen from the inside of the cabinet 10 and the housing 8 is maximized. Thus, as shown in FIGS. 2 and 4, a dip 5 appears in the middle and high bands of the sound pressure versus frequency characteristic.

FIGS. 2 and 4 illustrate the sound pressures measured just in front of the outlet of the port 11.

A resonance frequency $f_R$ and an antiresonance frequency $f_A$ of the port 11 are expressed by the following equations (4) and (5)

$$f_R = 2n\, c/4\, L_\theta \tag{4}$$

$$f_A = (2\,n-1)\, c/4\, L_\theta \tag{5}$$

where c represents the sound velocity.

In the aforenoted example of numerical values, the resonance frequencies $f_R$ of 2λ/4, 4λ/4 . . . modes and the antiresonance frequencies $f_A$ of 1λ/4, 3λ/4 . . . modes are provided as represented on table 1 with respect to the speaker system and are provided as represented on table 2 with respect to the headphone system. It will be seen in tables 1 and 2 that those resonance frequencies $f_R$ and antiresonance frequencies $f_A$ correspond with frequencies at the peaks 6 and the dips 5 shown in FIGS. 2 and 4.

TABLE 1

| n | $f_A$ (kHz) | $f_R$ (kHz) |
|---|---|---|
| 1 | 1.18 | 2.36 |
| 2 | 3.54 | 4.72 |
| 3 | 5.90 | 7.08 |
| 4 | 8.26 | 9.54 |

TABLE 2

| n | $f_A$ (kHz) | $f_R$ (kHz) |
|---|---|---|
| 1 | — | 1.38 |
| 2 | 2.07 | 2.76 |
| 3 | 3.45 | 4.15 |

Accordingly, it is a general object of the present invention to provide an improved electroacoustic transducer having two ducts which can eliminate the aforenoted short comings and disadvantages of the prior art.

More specifically, it is an object of the present invention to provide an electroacoustic transducer having two ducts which can prevent tone quality of a reproduced sound from being deteriorated due to resonance and antiresonance of ports.

It is another object of the present invention to provide an electroacoustic transducer having two ducts which is suitably applied to a bass-reflex speaker system.

It is still another object of the present invention to provide an electroacoustic transducer having two ducts which is suitably applied to a bass-reflex headphone.

It is a further object of the present invention to provide an electroacoustic transducer having two ducts which is suitably applied to a bass-reflex earphone.

According to an aspect of the present invention, an electroacoustic transducer apparatus is comprised of an electroacoustic transducing element supplied with an input signal, a housing in which the electroacoustic transducing element is attached, and a plurality of sound ducts communicating the inside and outside of the housing, wherein the sound ducts are different in length and are equal in equivalent mass.

The above, and other objects, features and advantages of the present invention will be apparent in the following detailed description of the preferred embodiments when read in conjunction with the accompanying drawings, in which like reference numerals are used to identify the same or similar parts in the several views.

DETAILED DESCRIPTION OF THE PREFERRED EMBODIMENTS

Figure 1:
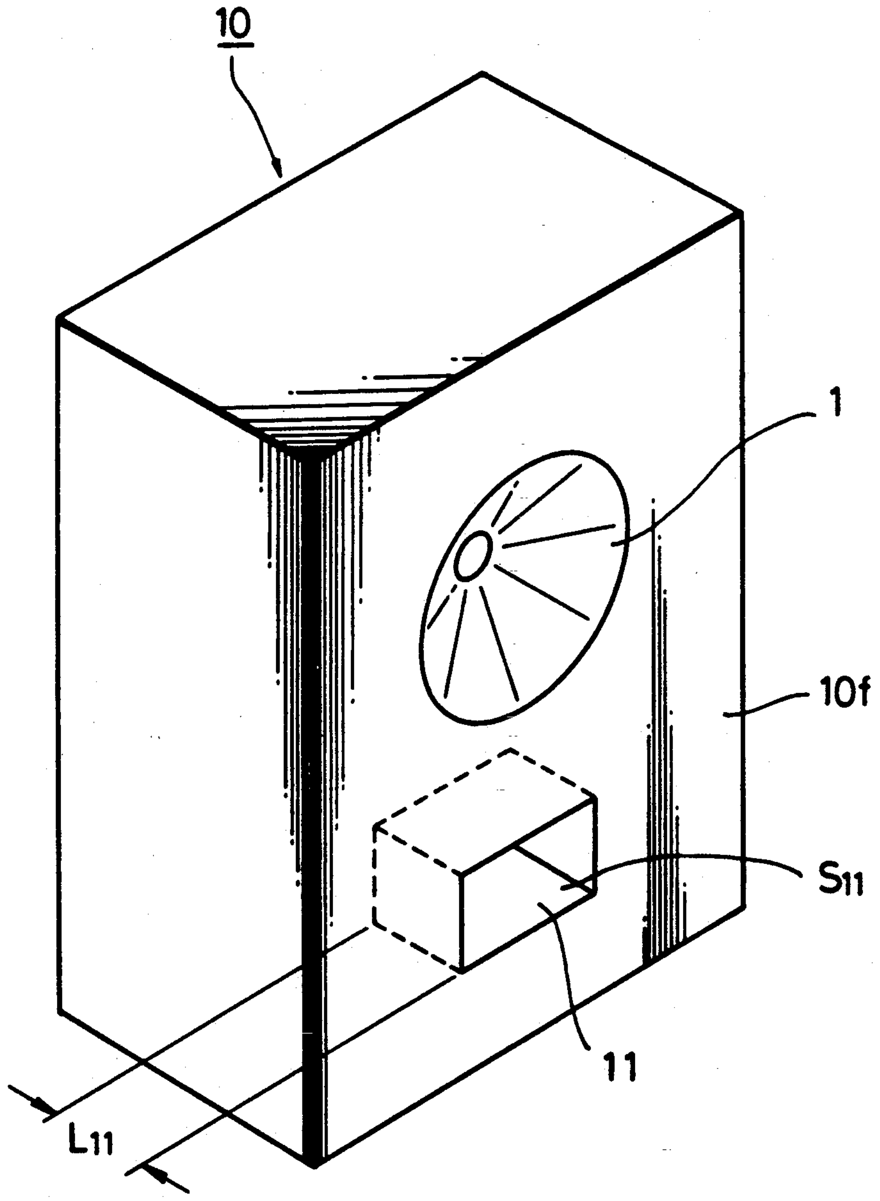
FIG. 1 (PRIOR ART)
FIG. 1 is a perspective view illustrating an example of a bass-reflex speaker system according to the prior art.
Figure 2:
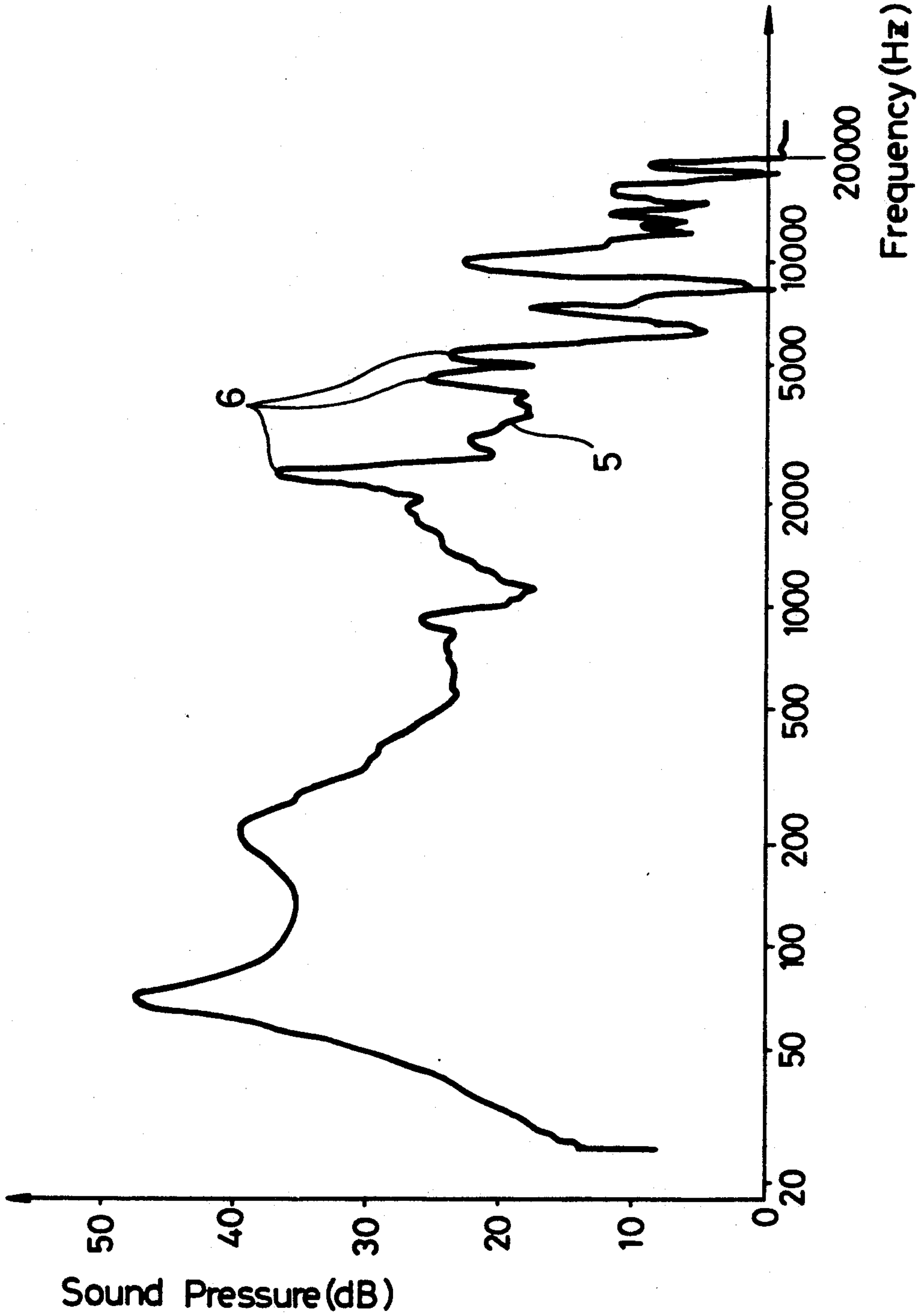
FIG. 2 (PRIOR ART)
FIG. 2 is a graph of a sound pressure versus frequency characteristic of the bass-reflex speaker system of FIG. 1.

Referring to the drawings in detail and initially to FIGS. 5 and 6, a first embodiment of the present invention will hereinafter be described, in which the electroacoustic transducer of the present invention is applied to a bass-reflex speaker system.

Figure 5:
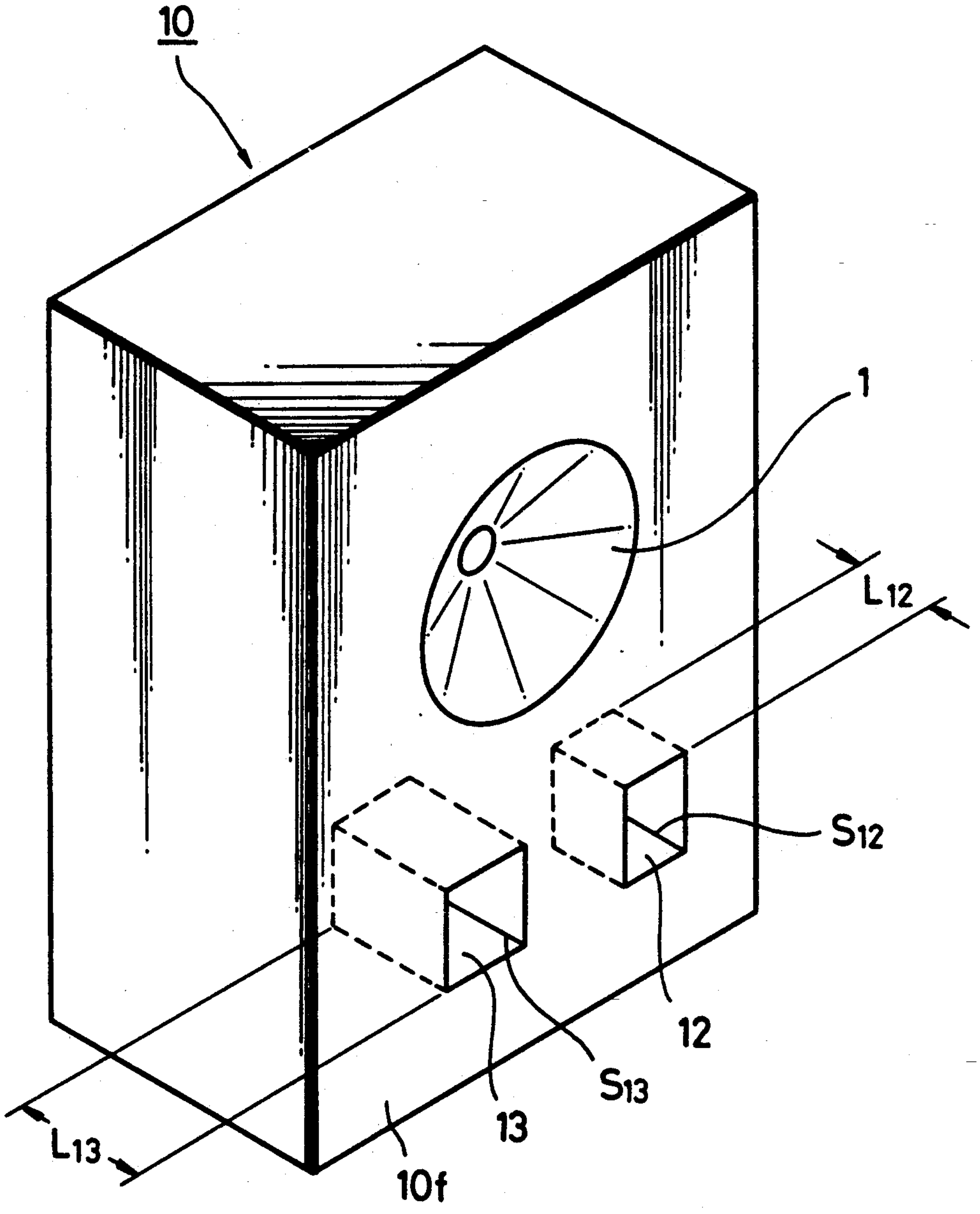
FIG. 5 is a perspective view of a first embodiment of the present invention in which the electroacoustic transducer of the invention is applied to a bass-reflex speaker cabinet.

FIG. 5 schematically illustrates an arrangement of the first embodiment of the present invention. In FIG. 5, like parts corresponding to those of FIG. 1 are marked with the same references and therefore need not be described in detail.

As shown in FIG. 5, there is provided the cabinet 10 in which two ports or ducts 12 and 13 are provided at the front wall 10f with a predetermined spacing therebetween. The effective lengths and cross section areas of the two ducts 12 and 13 are determined so as to satisfy the following equations (6) and (7):

$$L_{\theta 1\,2}=(3/2)L_{\theta 1\,3} \quad (6)$$

$$L_{\theta 1\,2}/S_{1\,2}=L_{\theta 1\,3}/S_{1\,3} \quad (7)$$

As is clear from the comparison of the equation (7) with the aforenoted equation (1), the equivalent masses of the two ducts 12 and 13 are selected to be the same in this embodiment. When the two ducts 12 and 13 are seen from the inside of the cabinet 10, they are provided in parallel to each other so that equivalent masses $m_{1\,2}$ and $m_{1\,3}$ of the two ducts 12 and 13 are determined to be twice the equivalent mass $m_{1\,1}$ of the single duct 11 (see FIG. 1).

If the speaker cabinet having the same volume as that of the cabinet of the speaker system of the example of the prior art shown in FIG. 1 is employed, the lengths and cross section areas of the ducts 12 and 13 are determined, by way of example, as follows:

| | |
|---|---|
| $L_{12}$ = 4.8 cm, | $L_{13}$ = 7.2 cm |
| $S_{12}$ = 1.33 cm$^2$, | $S_{13}$ = 1.9 cm$^2$ |

In that case, the effective lengths and equivalent masses of the ducts 12 and 13 are as follows:

| | |
|---|---|
| $L_{e\,12}$ = 5.9 cm, | $L_{e\,13}$ = 8.5 cm |
| $m_{12}$ = 2.04 g, | $m_{13}$ = 2.06 g |

Further, resonance frequencies $f_R$ and antiresonance frequencies $f_A$ of respective modes of the ducts 12 and 13 are represented on the following tables 3 and 4:

TABLE 3

| n | $f_{A\,12}$ (kHz) | $f_{R\,12}$ (kHz) |
|---|---|---|
| 1 | 1.44 | 2.88 |
| 2 | 4.32 | 5.76 |
| 3 | 7.19 | 8.64 |

TABLE 3-continued

| n | $f_{A\,12}$ (kHz) | $f_{R\,12}$ (kHz) |
|---|---|---|
| 4 | 10.1 | 11.5 |

TABLE 4

| n | $f_{A\,13}$ (kHz) | $f_{R\,13}$ (kHz) |
|---|---|---|
| 1 | 1.00 | 2.00 |
| 2 | 2.99 | 3.99 |
| 3 | 4.99 | 5.99 |
| 4 | 6.98 | 7.98 |

In this embodiment, since the effective lengths of the two ducts 12 and 13 are determined in accordance with the equation (6), the resonance frequency $f_{R\,12}(\frac{1}{2})=2.88$ kHz of the λ/2 mode of the shorter duct 12 and the antiresonance frequency $f_{A\,13}(\frac{3}{4})=2.99$ kHz or the 3λ/4 mode of the longer duct 13 become equal to each other.

Figure 6:
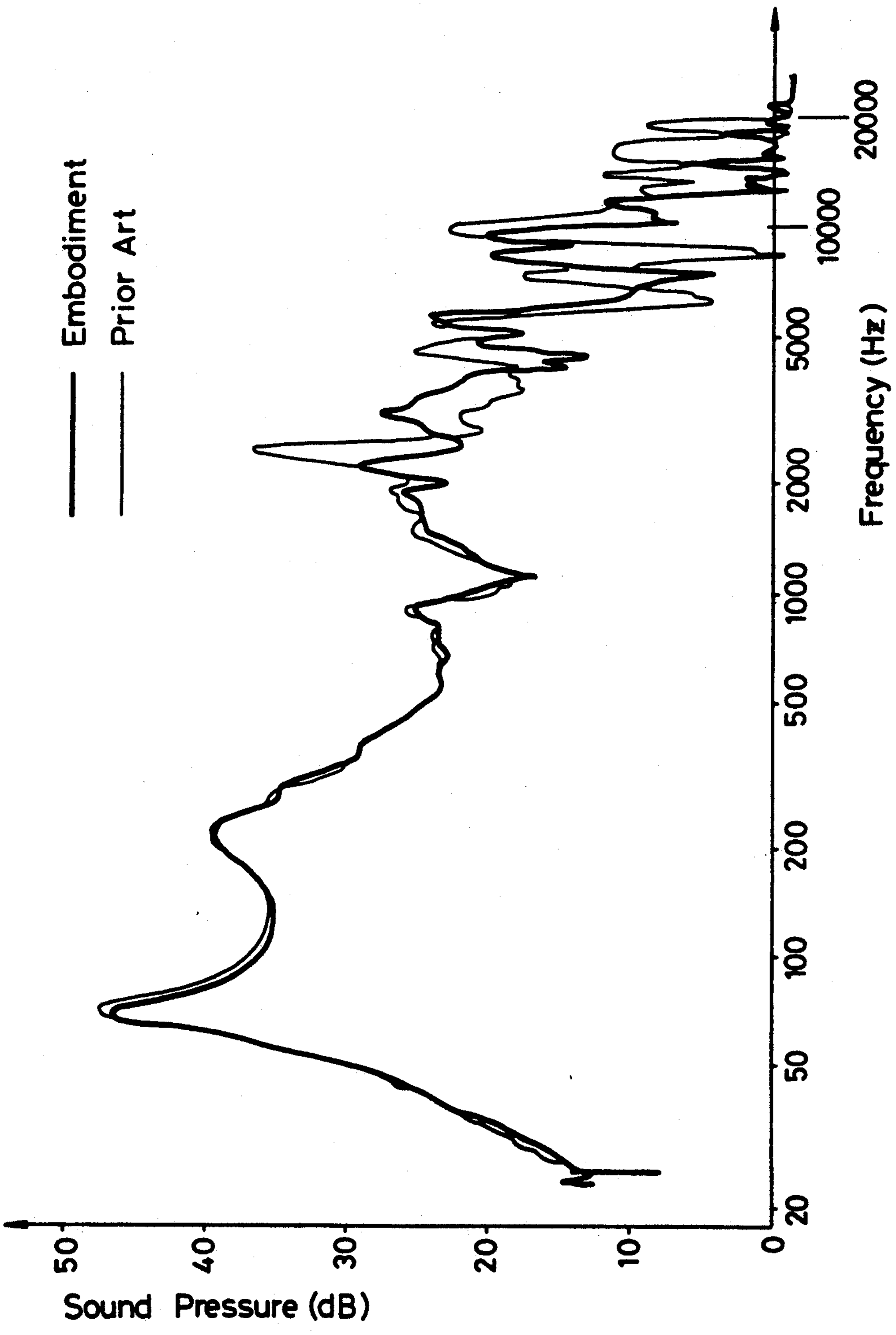
FIG. 6 is a graph of a sound pressure versus frequency characteristic of the bass-reflex speaker cabinet shown in FIG. 5.

Thus, the λ/2 mode resonance of the duct 12 and the 3λ/4 mode antiresonance of the duct 13 counteract each other so that, as shown by a bold line in FIG. 6, the large peak at this frequency is removed as compared with the frequency characteristic of the prior art shown by a fine line in FIG. 6, resulting in the tone quality of the reproduced sound being improved.

As is clear from the tables 3 and 4, it is frequently observed that the resonance frequency of one duct and the antiresonance frequency of the other duct are substantially equal to each other. Also at such frequency, the peak and the dip are reduced.

While the two ducts are used in the above-mentioned embodiment of the present invention, it is possible to employ a plurality of ducts, for example, more than three ducts. In general, if k ducts are used, the following equations (8) and (9) are established:

$$L_{\theta 1}=(3/2)L_{\theta 2}\ldots=(3/2)^{k-1}L_{\theta k} \quad (8)$$

$$L_{\theta 1}/S_1=L_{\theta 2}/S_2\ldots=L_{\theta k}/S_k=k\cdot m_o \quad (9)$$

where the effective lengths and the cross section areas of the respective ports are expressed as $L_{74\,1}$, $L_{74\,2}\ldots L_{\theta k}$ and $S_1$, $S_2\ldots S_k$, respectively.

In the equation (9), $m_o$ represents the equivalent mass when the single duct is provided.

Figure 7:
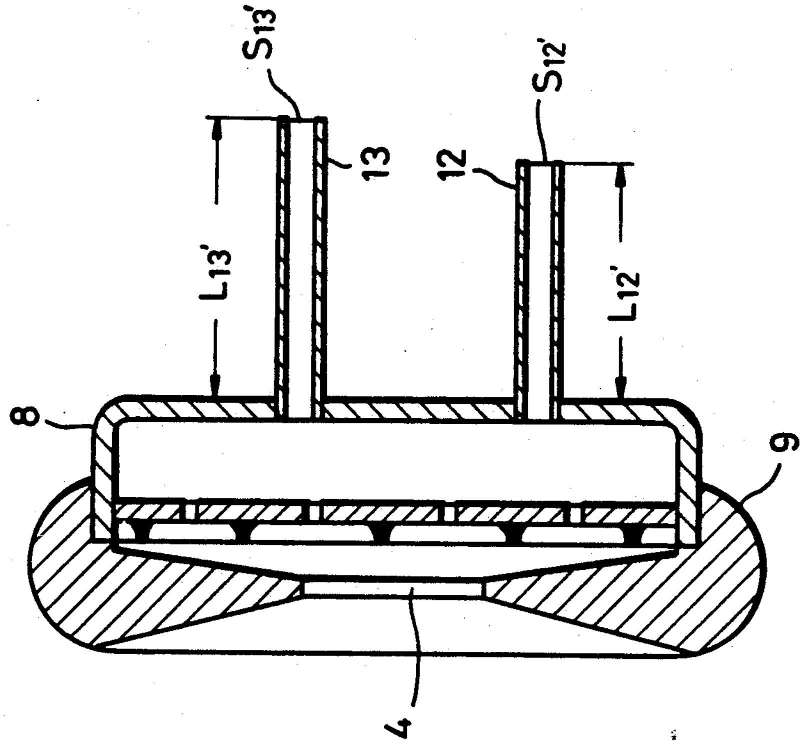
FIG. 7 is a fragmentary, side view of a section illustrating a second embodiment of the present invention in which the electroacoustic transducer of the present invention is applied to a headphone or earphone, and to which reference will be made in order to understand the principle of the present invention.

While the electroacoustic transducer of the present invention is applied to the speaker system in the above embodiment, a second embodiment of the present invention in which the two ducts 12 and 13 are provided in the headphone unit 9 will be described with reference to FIGS. 7 and 8.

Figure 3:
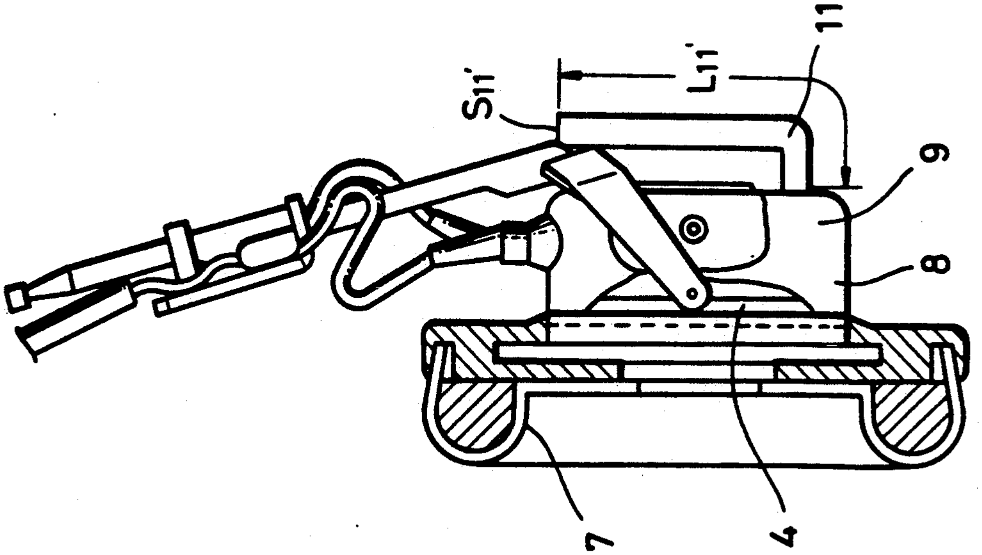
FIG. 3 (PRIOR ART)
FIG. 3 is a side view of a section illustrating an example of a bass-reflex headphone according to the prior art.
Figure 4:
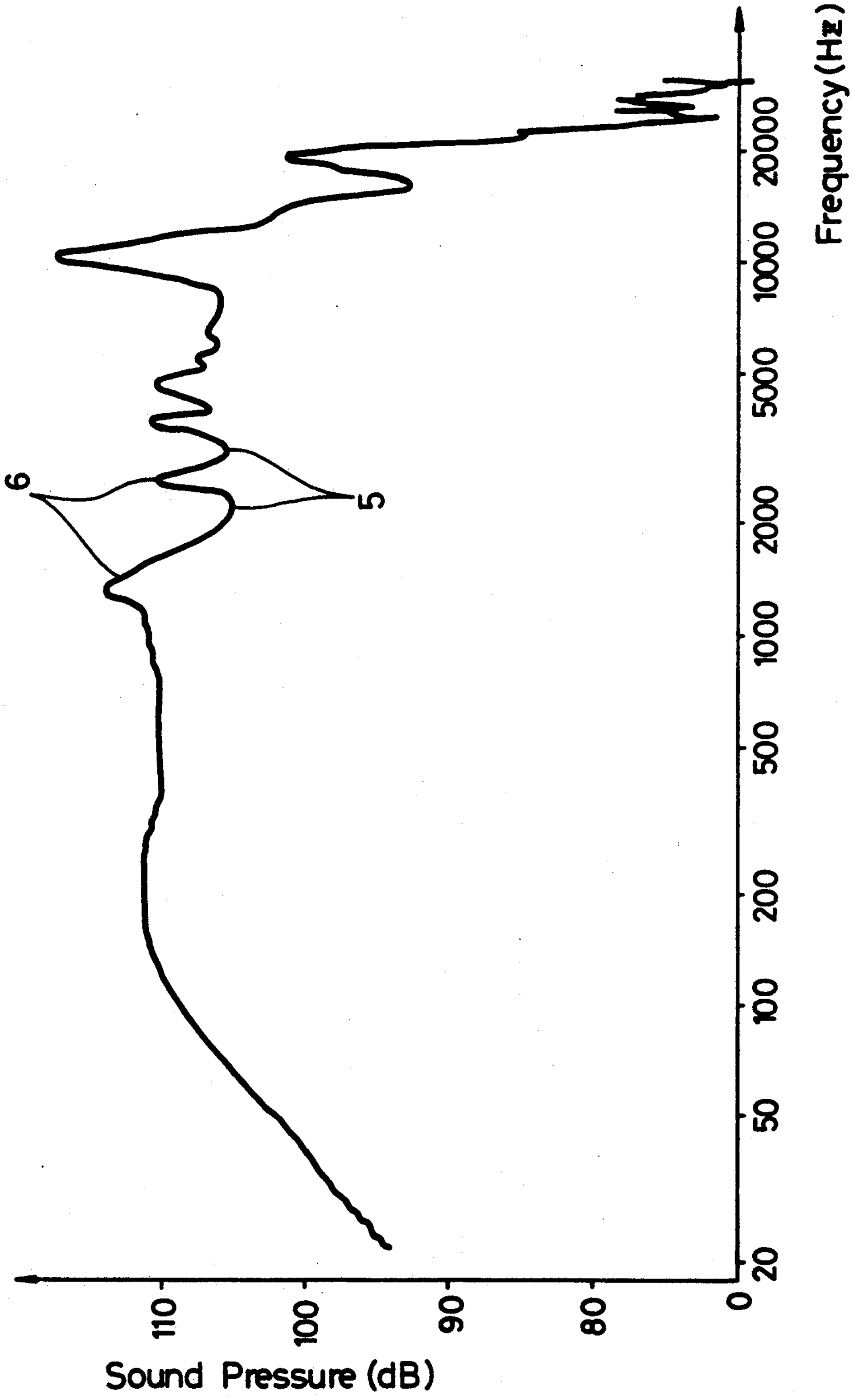
FIG. 4 (PRIOR ART)
FIG. 4 is a graph of a sound pressure versus frequency characteristic of the bass-reflex headphone system of FIG. 3.

When equivalent masses $m_{1\,2'}$ and $m_{1\,3'}$ of the ducts 12 and 13 are selected to be equal to each other, the headphone unit 9 uses the housing 8 of the same volume as the volume of the same headphone unit as that of the example of the prior art shown in FIG. 3. In this case, the lengths and cross section areas of these ports or ducts 12 and 13 are determined, by way of example, as follows:

| | |
|---|---|
| $L_{12'}$ = 8 cm, | $L_{13'}$ = 12 cm |
| $S_{12'}$ = 2.3 $mm^2$, | $S_{13'}$ = 3.4 $mm^2$ |

In that case, the effective lengths and equivalent masses of the two ducts 12 and 13 are given as follows:

| | |
|---|---|
| $L_{e\,12'}$ = 8 cm, | $L_{e\,13'}$ = 12.2 cm |
| $m_{12'}$ = 21.2 g, | $m_{13'}$ = 21.4 g |

Further, resonance frequencies $f_R$ and antiresonance frequencies $f_A$ of respective modes of the two ducts 12 and 13 are represented on the following tables 5 and 6:

TABLE 5

| n | $f_{A\,12'}$ (kHz) | $f_{R\,12'}$ (kHz) |
|---|---|---|
| 1 | 1.05 | 2.10 |
| 2 | 3.15 | 4.20 |
| 3 | 5.25 | 6.30 |
| 4 | 7.35 | 8.40 |

TABLE 6

| n | $f_{A\,13'}$ (kHz) | $f_{R\,13'}$ (kHz) |
|---|---|---|
| 1 | 0.70 | 1.39 |
| 2 | 2.09 | 2.79 |
| 3 | 3.48 | 4.18 |
| 4 | 4.87 | 5.57 |

Also in this embodiment, the effective lengths of the two ducts 12 and 13 are determined in accordance with the equation (6), whereby the resonance frequency $f_{R\,12'}(\frac{1}{2})=2.10$ kHz of the λ/2 mode of the shorter duct 12 and the antiresonance frequency $f_{A\,13'}(\frac{3}{4})=2.09$ kHz of the 3λ/4 mode of the longer port 13 are made equal to each other.

Figure 8:
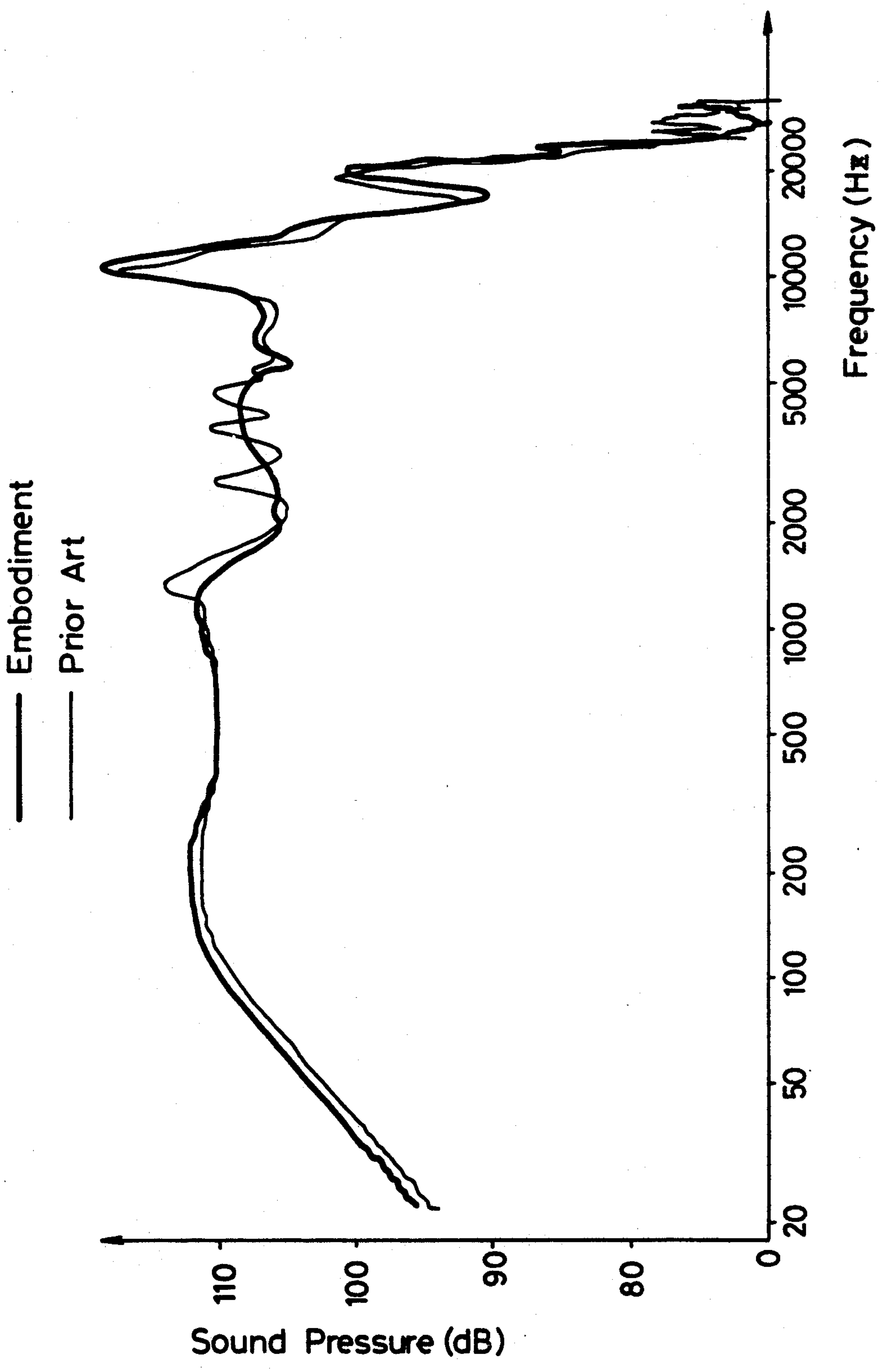
FIG. 8 is a graph of a sound pressure versus frequency characteristic of the headphone or earphone of FIG. 7.

Therefore, the λ/2 mode resonance of the duct 12 and the 3λ/4 mode antiresonance of the duct 13 counteract each other so that, as shown by a bold line in FIG. 8, the large peak at this frequency is removed as compared with the example of the prior art shown by a fine line in FIG. 8, resulting in a tone quality of a reproduced sound being improved.

Figure 9A:
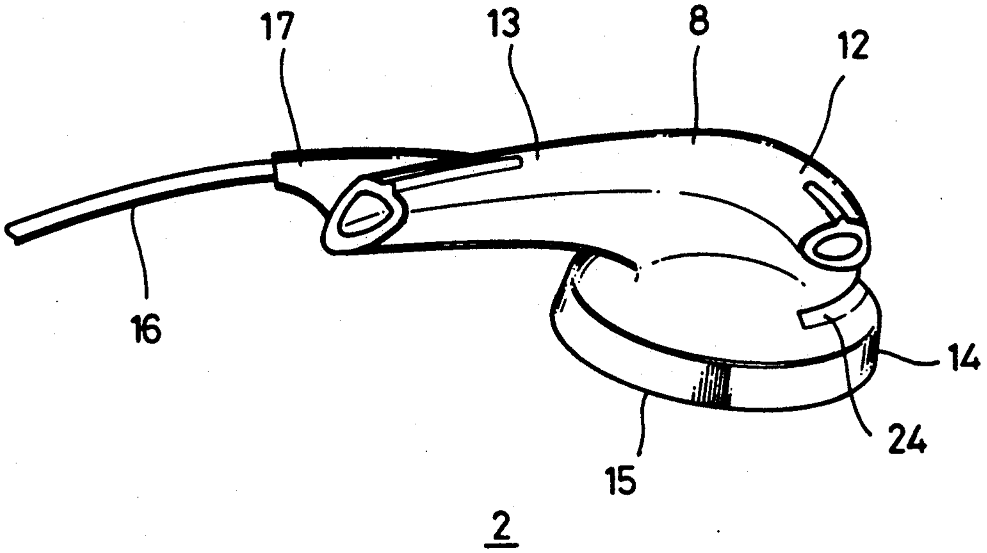
FIGS. 9A and 9B are perspective views illustrating a third embodiment of the present invention in which the electroacoustic transducer of the present invention is applied to the earphone, respectively.
Figure 9B:
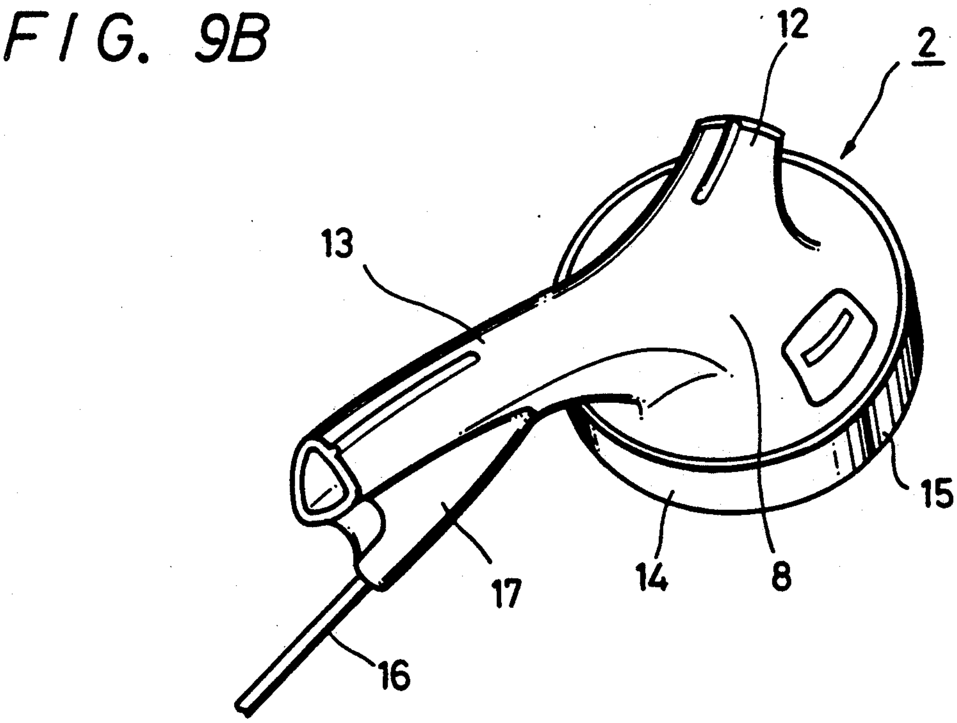
Figure 10A:
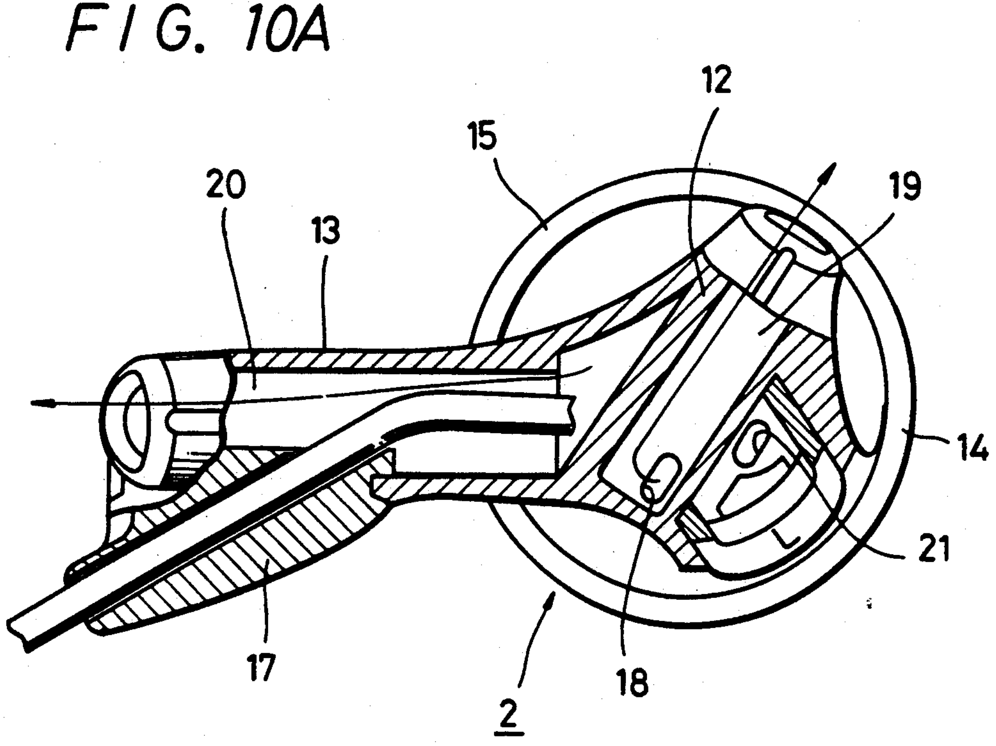
FIGS. 10 and 10B are cross-sectional views of a main portion of the third embodiment of the present invention.

A third embodiment of the present invention will be described with reference to FIGS. 9 to 11. FIGS. 9 to 11 illustrate a practical arrangement in which the present invention is applied to an earphone. FIGS. 9A and 9B show an external appearance of the earphone of this embodiment, FIGS. 10A and 10B illustrate cross-sectional diagrams of the main portion of FIGS. 9A and 9B, and FIGS. 11A and 11B show a plan view and a longitudinal cross-sectional view of the housing portion and a duct portion from which a diaphragm is removed.

Throughout FIGS. 9 to 11, reference numeral 2 designates an earphone unit in which a diaphragm 3 is provided in an opposing relation to a sound emanating plate 4 having a number of sound-emanating apertures to transmit a sound to a tympanic membrane. A frame member 14, which is molded of a hard rubber or the like is used to encircle the peripheral portion of the sound emanating plate 4 to thereby form a diaphragm unit 15. This frame member 14 is inserted into the auricle when this earphone is in use. The housing 8 is engaged with the frame member 14 of the diaphragm unit 15. The housing 8 is formed of a synthetic resin such as polypropylene resin and the like. As shown in FIGS. 9A and 9B, the first and second ports or ducts 12 and 13 are integrally formed with the housing 8, and an earphone cord deriving portion 17 is also integrally formed with the housing 8.

As shown in FIGS. 10A, 10B and FIGS. 11A and 11B, the housing 8 is comprised of a cup portion 8a substantially shaped as a small bowl and which is engaged with the frame member 14. A through-hole 18 is formed near the vertex portion of the cup portion 8a to be communicated with a communication aperture 19 of the first port (or duct) 12. A through-hole 21 is formed through the nearby portion of the vertex of the cup portion 8a at the position different from that of the through-hole 18 and which is communicated with a communication aperture 20 of the second port (or duct) 13. An earphone cord 16 connected to the diaphragm 3 is led out from an earphone cord attaching portion 17 attached to one portion of the second duct 13 via a through-hole 22 formed through the same cup portion 8a and the communication aperture 20 of the second port or duct 13.

Figure 10B:
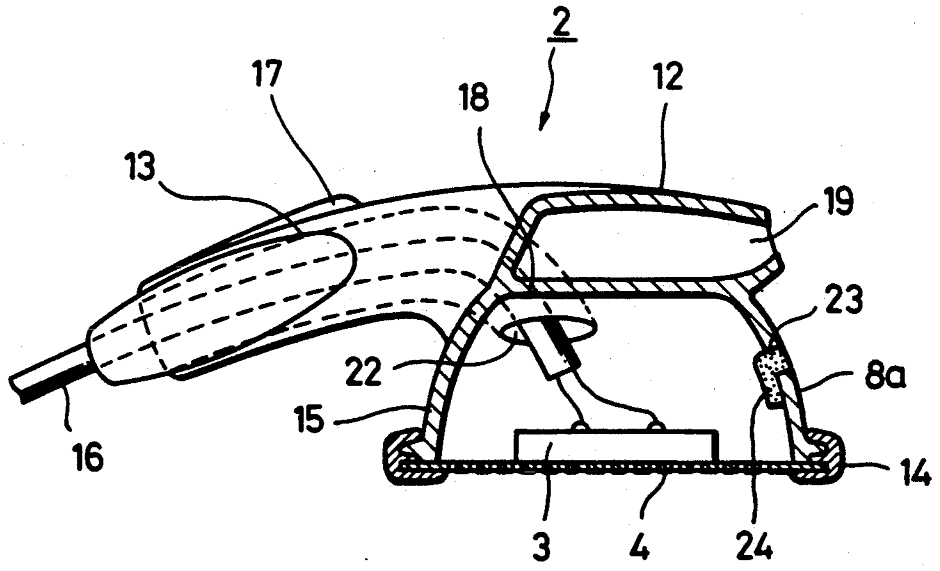
Figure 11A:
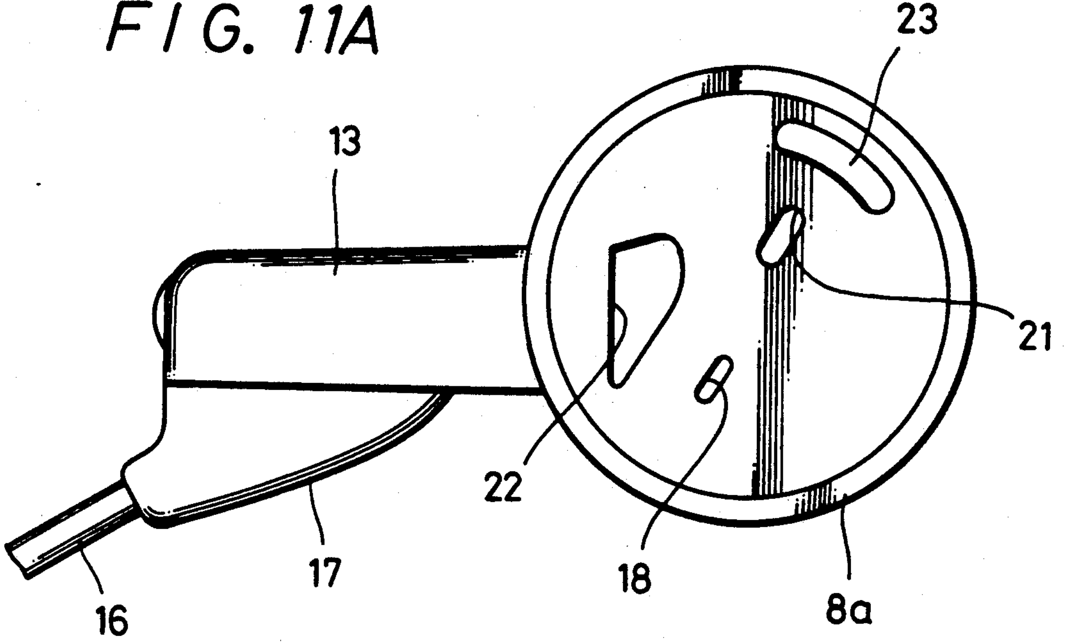
FIGS. 11A and 11B are a plan view and a longitudinal cross-sectional view of a housing portion of the earphone of FIGS. 9A and 9B, respectively.
Figure 11B:
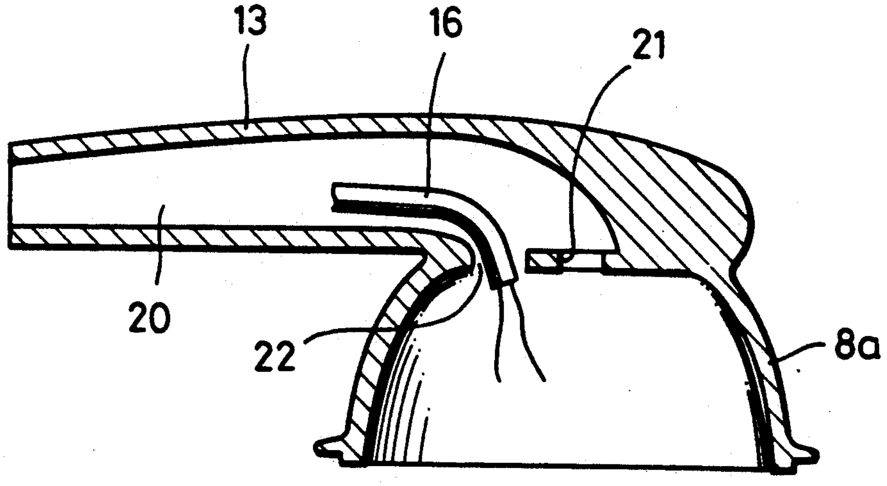

As shown in FIGS. 10B and 11A, a member 24 inserted into a through-hole 23 formed through the cup portion 8a is made of a foaming resin such as a sponge and the like. This member 24 is used to fine adjust the equivalent resistance within the housing 8. Alternatively, this member 24 may be bonded to the inner surface of the cup portion 8a by a bonding agent or the like.

The effective lengths and equivalent masses of the first and second ducts 12 and 13 are given, by way of example, as follows:

| | |
|---|---|
| $L_{e\,12''} = 13.4$ mm, | $L_{e\,13''} = 19.7$ mm |
| $m_{12''} = 0.190$ g, | $m_{13''} = 0.186$ g |

where the lengths and cross section area of the first and second ports or ducts 12 and 13 are determined as

| | |
|---|---|
| $L_{12''} = 12$ mm, | $L_{13''} = 18$ mm |
| $S_{12''} = 2$ mm$^2$, | $S_{13''} = 3$ mm$^2$ |

Therefore, the $\lambda/2$ mode resonance of the first port 12 and the $3\lambda/4$ mode antiresonance of the second port 13 become substantially about 12.7 kHz and cancel each other out, thereby improving the frequency characteristic. Thus, it is possible to prevent the tone quality of the reproduced sound from being deteriorated due to the resonance and the antiresonance.

While the two ports are used in the above-described embodiments, it is possible to use a plurality of ports, for example, more than three ports with the same action and effects being achieved.

According to the present invention, as set forth above, since the plurality of ports having the equal equivalent mass and which have different lengths are employed, it is possible to obtain the electroacoustic transducer apparatus which can prevent the tone quality of the reproduced sound from being deteriorated due to the resonance and the antiresonance.

Having described the preferred embodiments of the invention with reference to the accompanying drawings, it is to be understood that the invention is not limited to those precise embodiments and that various changes and modifications thereof could be effected by one skilled in the art without departing from the spirit or scope of the invention as defined in the appended claims.

We claim as our invention:

1. An electroacoustic transducer apparatus comprising:

(a) an electroacoustic transducing element supplied with an input signal;

(b) a sealed housing which surrounds said electroacoustic transducing element so that a sound producing surface of said electroacoustic transducer is exposed through one wall of said sealed housing; and (c) a plurality of sound ducts arranged inside said housing and separated from said transducing element and communicating the inside and outside of said sealed housing, wherein said sound ducts are different in length and have equal equivalent masses.

2. The electroacoustic transducer apparatus as cited in claim 1, wherein said sealed housing serves as an enclosure of a speaker.

3. The electroacoustic transducer apparatus as cited in claim 1, wherein said sealed housing serves as a headphone housing.

4. The electroacoustic transducer apparatus as cited in claim 1, wherein said sealed housing is shaped so as to be inserted into an auricle of the user.

5. The electroacoustic transducer apparatus as cited in claim 4, wherein a signal line to supply the input signal to said electroacoustic transducing element is led out through at least one sound duct of said plurality of sound ducts.

6. The electroacoustic transducer apparatus as cited in claim 4, wherein said sealed housing has formed therein a through-hole to control an equivalent resistance of the inside of said sealed housing.

7. The electroacoustic transducer apparatus as cited in claim 6, wherein adjusting means is engaged with said through-hole so as to adjust the equivalent resistance of said sealed housing.

* * * * *